United States Patent
Kim

(10) Patent No.: US 8,779,416 B2
(45) Date of Patent: Jul. 15, 2014

(54) ORGANIC LIGHT EMITTING DIODE DISPLAY

(71) Applicant: Samsung Display Co., Ltd., Yongin (KR)

(72) Inventor: Ok-Byoung Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/688,074

(22) Filed: Nov. 28, 2012

(65) Prior Publication Data

US 2014/0001445 A1  Jan. 2, 2014

(30) Foreign Application Priority Data

Jul. 2, 2012  (KR) .................. 10-2012-0071877

(51) Int. Cl.
*H01L 29/08* (2006.01)

(52) U.S. Cl.
USPC .................. 257/40; 257/88; 257/E51.022

(58) Field of Classification Search
USPC ...................... 257/40, 88, E51.022
See application file for complete search history.

(56) References Cited

U.S. PATENT DOCUMENTS

2006/0060858 A1*  3/2006  Park et al. ............ 257/66
2011/0266544 A1*  11/2011  Park et al. ............ 257/59

FOREIGN PATENT DOCUMENTS

| JP | 4234363 B2 | 12/2008 |
|---|---|---|
| KR | 10-1006439 B1 | 12/2010 |
| KR | 10-1026811 B1 | 3/2011 |

* cited by examiner

*Primary Examiner* — Trung Q Dang
(74) *Attorney, Agent, or Firm* — Knobbe, Martens, Olson & Bear, LLP

(57) ABSTRACT

An organic light emitting diode (OLED) display is disclosed. In one aspect, the OLED display includes: i) gate wires positioned on a substrate in a first direction, ii) data wires positioned on the gate wires in a second direction crossing the first direction, iii) a pixel circuit including first thin film transistors respectively connected to the gate wires and the data wires and iii) an OLED connected to the pixel circuit. The first thin film transistor may also include a first active layer interconnecting the data wires and the OLED and including a channel region and source and drain regions doped with an impurity, and a first gate electrode positioned over the first active layer with first and second insulation layers sequentially interposed therebetween, wherein the second insulation layer is positioned on the channel region.

14 Claims, 11 Drawing Sheets

ORGANIC LIGHT EMITTING DIODE DISPLAY

RELATED APPLICATION

This application claims priority to and the benefit of Korean Patent Application No. 10-2012-0071877 filed in the Korean Intellectual Property Office on Jul. 2, 2012, the entire contents of which are incorporated herein by reference.

BACKGROUND

1. Field

The described technology generally relates to an organic light emitting diode (OLED) display.

2. Description of the Related Art

An OLED display generally includes two electrodes facing each other and an organic layer interposed between the two electrodes. Holes injected from one electrode and electrons injected from the other electrode are combined in the organic layer to form excitons, and the excitons generate energy, thereby emitting light.

An OLED display typically includes a plurality of pixels and the OLED is positioned in each pixel. Also, each pixel has a pixel circuit including a plurality of thin film transistors and at least one capacitor to drive the OLED. The thin film transistors basically include a driving thin film transistor and a switching thin film transistor.

SUMMARY

One inventive aspect is an OLED display including a pixel circuit including a plurality of thin film transistors and at least one capacitor.

Another aspect is an OLED display with a widened a driving range of a gate voltage by forming a thick insulation layer in at least one thin film transistor among a plurality of thin film transistors and simultaneously smoothing impurity doping of an active layer.

Another aspect is an OLED display which includes: gate wires positioned on a substrate and formed according to a first direction; data wires positioned on the gate wires and formed according to a second direction crossing the first direction; a pixel circuit including first thin film transistors respectively connected to the gate wires and the data wires; and an organic light emitting diode (OLED) connected to the pixel circuit. The first thin film transistor includes a first active layer connecting between the data wires and the organic light emitting diode (OLED) and including a channel region and a source region and drain region doped with an impurity, and a first gate electrode positioned on the first active layer via a first insulation layer and a second insulation layer sequentially deposited, and the second insulation layer is positioned on the channel region.

The second insulation layer may be patterned by a photoresist layer for a patterning of the first gate electrode formed on the first gate electrode as an etching mask, and the first gate electrode may do not doped with the impurity.

The pixel circuit may further include a first capacitor connected to the data wires. The first capacitor may include a first capacitor electrode positioned on the first insulation layer and connected to the first gate electrode, and a second capacitor electrode positioned on the first capacitor electrode via the second insulation layer and connected to the data wires.

The second capacitor electrode may be positioned at the same layer as the first gate electrode and with the same metal layer as the first gate electrode.

The pixel circuit may further include a second capacitor connected to the gate wires. The second capacitor may include a third capacitor electrode positioned on the first insulation layer and connected to the first capacitor electrode, and a fourth capacitor electrode positioned on the third capacitor electrode via the second insulation layer and connected to the gate wires.

The fourth capacitor electrode may be positioned at the same layer as the first gate electrode and is formed with the same metal layer as the first gate electrode.

The pixel circuit may further include the second thin film transistor connected to the first thin film transistor. The second thin film transistor may include a second active layer connecting between the data wires and the first thin film transistor and including a channel region and a source region and drain region doped with the impurity, and a second gate electrode positioned on the second active layer via the first insulation layer, connected to the gate wires, and doped with the impurity.

The first capacitor electrode and the third capacitor electrode may be positioned at the same layer as the second gate electrode and formed with the same metal layer as the second gate electrode.

The pixel circuit further may include the second thin film transistor connected to the first thin film transistor, The second thin film transistor may include a second active layer connecting between the data wires and the first thin film transistor and including a channel region and a source region and drain region doped with the impurity, and a second gate electrodes positioned on the second active layer via the first insulation layer and the second insulation layer that are sequentially deposited, wherein the second insulation layer may be positioned on the channel region.

The second insulation layer may be patterned by using a photoresist layer for patterning the second gate electrode formed on the second gate electrode as an etching mask, and the second gate electrode may not be doped with the impurity.

The second capacitor electrode is formed with a larger width than the first capacitor electrode, and the fourth capacitor electrode may be formed with a larger width than the third capacitor electrode. The first capacitor electrode may be formed with a larger width than the second capacitor electrode, and the third capacitor electrode may be formed with a larger width than the fourth capacitor electrode.

Another aspect is an organic light emitting diode (OLED) display which includes: gate wires positioned on a substrate and formed according to a first direction; data wires positioned on the gate wires and formed according to a second direction crossing the first direction; a pixel circuit including a plurality of first thin film transistors respectively connected to the gate wires and the data wires; and an organic light emitting diode (OLED) connected to the pixel circuit. At least one thin film transistor among a plurality of thin film transistors includes a gate electrode positioned on an active layer via a first insulation layer and a second insulation layer that are sequentially deposited, while the rest of the thin film transistors include a gate electrode positioned on the active layer via the first insulation layer, and the second insulation layer has the same width as the gate electrode on the second insulation layer.

The gate electrode of at least one thin film transistor may be not doped with the impurity, and the gate electrode of the rest thin film transistor may be doped with the impurity.

DETAILED DESCRIPTION

Figure 1:
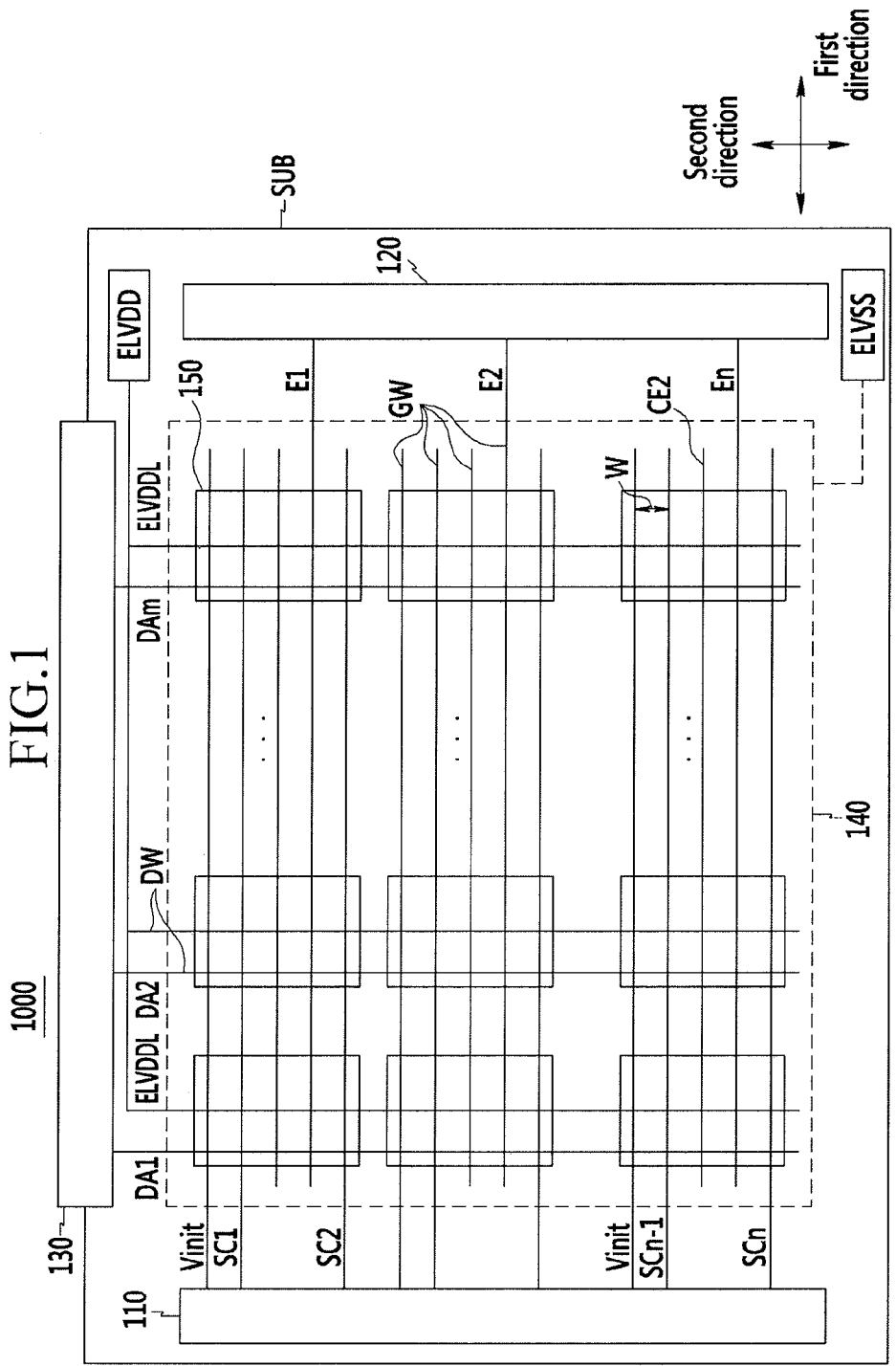
FIG. 1 is a schematic diagram of an organic light emitting diode (OLED) display according to a first embodiment.

Recently, to widen a driving range of a gate voltage applied to a gate electrode of the driving thin film transistor, a thick insulation layer has been formed between an active layer and a gate electrode of the driving thin film transistor, compared with the switching thin film transistor.

However, when doping an impurity to a source region and a drain region of an active layer by using a gate electrode of the driving thin film transistor as a mask, the impurity doping is not smooth because of the thicker insulation layer. Accordingly, it is difficult to increase the thickness of the insulation layer of the driving thin film transistor more than a predetermined degree, and there is a difficulty in a process increasing the doping accelerating voltage.

Embodiments will be described more fully hereinafter with reference to the accompanying drawings. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification. In addition, the size and thickness of each component shown in the drawings are arbitrarily shown for better understanding and ease of description, but the present disclosure is not limited thereto.

In the drawings, the thickness of layers, films, panels, regions, etc., may be exaggerated for clarity. In the drawings, for better understanding and ease of description, the thickness of some layers and areas may be exaggerated. It will be understood that when an element such as a layer, film, region, or substrate is referred to as being "on" another element, it can be directly on the other element or intervening elements may also be present.

In addition, the accompanying drawings illustrate an active matrix (AM) type of organic light emitting diode (OLED) display having a 6Tr-2Cap structure in which each pixel is provided 6 thin film transistors (TFTs) and two capacitors, but the number of thin film transistors and capacitors is not limited to the example. Here, the pixel refers to a minimum unit for displaying an image, and the OLED display displays an image through the plurality of pixels.

FIG. 1 is a schematic diagram of an OLED display according to a first embodiment.

Referring to FIG. 1, the OLED display 1000 includes a gate driver 110, gate wires GW, a light emission control driver 120, a data driver 130, data wires DW, a display unit 140, and pixels 150.

The gate driver 110 sequentially supplies scan signals to first scan lines SC2 to SCn or second scan lines SC1 to SCn-1 included in the gate wires GW corresponding to an external control circuit (not shown), for example, a control signal supplied from a timing controller. Then, pixels 150 are selected by the scan signal and sequentially receive data signals.

The gate wires GW are disposed on a substrate SUB and extended in a first direction. The gate wires GW include a first scan line SCn, a second scan line SCn-1, an initialization power line Vinit, and light emission control lines E1 to En. The first scan line SCn and the second scan line SCn-1 are connected to the gate driver 110 and receive the scan signal from the gate driver 110. The initialization power line Vinit is connected with the gate driver 110 and receives initialization power from the gate driver 110. The light emission control line En is connected with the light emission control driver 120, and receives a light emission control signal from the light emission control driver 120.

In the first embodiment, the initialization power line Vinit receives the initialization power from the gate driver 110, but in another embodiment, the initialization power line Vinit may be connected to another additional constituent element and receive initialization power from the other additional constituent element. The gate wires GW may be respectively provided in the same layer or may be respectively provided in different layers. In addition, the gate wires GW may respectively overlap each other or may not overlap each other.

The light emission control driver 120 sequentially supplies light emission control signals to the light emission control line En corresponding to a control signal supplied from an external source such as a timing controller. The light emission control signal controls a light emitting time of the pixel 150. The light emission control driver 120 may be omitted according to an inner structure of the pixel 150.

The data driver 130 supplies a data signal to a data line DAm among the data wires DM corresponding to the control signal supplied from the external source such as a timing controller. The data signal supplied to the data line DAm is supplied to a pixel 150 selected by a scan signal when the scan signal is supplied to the first scan line SCn. Then, the pixel 150 changes a voltage corresponding to the data signal and emits light with luminance corresponding thereto.

The data wires DW are disposed on the gate wires GW, and are extended in a second direction crossing the first direction. The data wires DW include data lines DA1 to DAm and a driving power line ELVDDL. The data lines DA1 to DAm are connected with the data driver 130, and receive a data signal from the data driver 130. The driving power line ELVDDL is connected with an external first power source ELVDD, and receives driving power from the first power source ELVDD.

The display unit 140 includes a plurality of pixels 150 provided in crossing areas of the gate wires GW and the data wires DW. Each pixel 150 include an OLED emitting light and a pixel circuit to control a driving current flowing to the OLED. The pixel circuit is connected to each of the gate wires GW and each of the data wires DW, and the organic light emitting diode is connected to the pixel circuit.

The OLED of the display unit 140 is connected with the external first power source ELVDD, interposing the pixel circuit therebetween, and is connected with the second power source ELVSS. The first power source ELVDD supplies driving power to the pixel 150, and the second power source ELVSS supplies common power to the pixel 150. The pixel 150 emits light with luminance corresponding to a driving current flowing through the OLED from the first power source ELVDD corresponding to the data signal according to the driving power and the common power supplied thereto.

Figure 2:
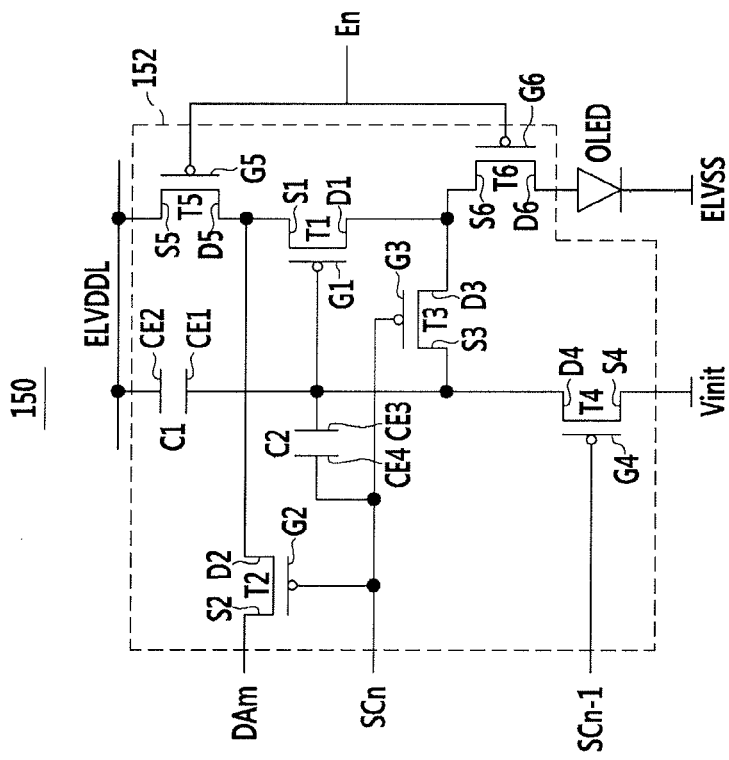
FIG. 2 is a circuit diagram of a pixel shown in FIG. 1.
Figure 3:
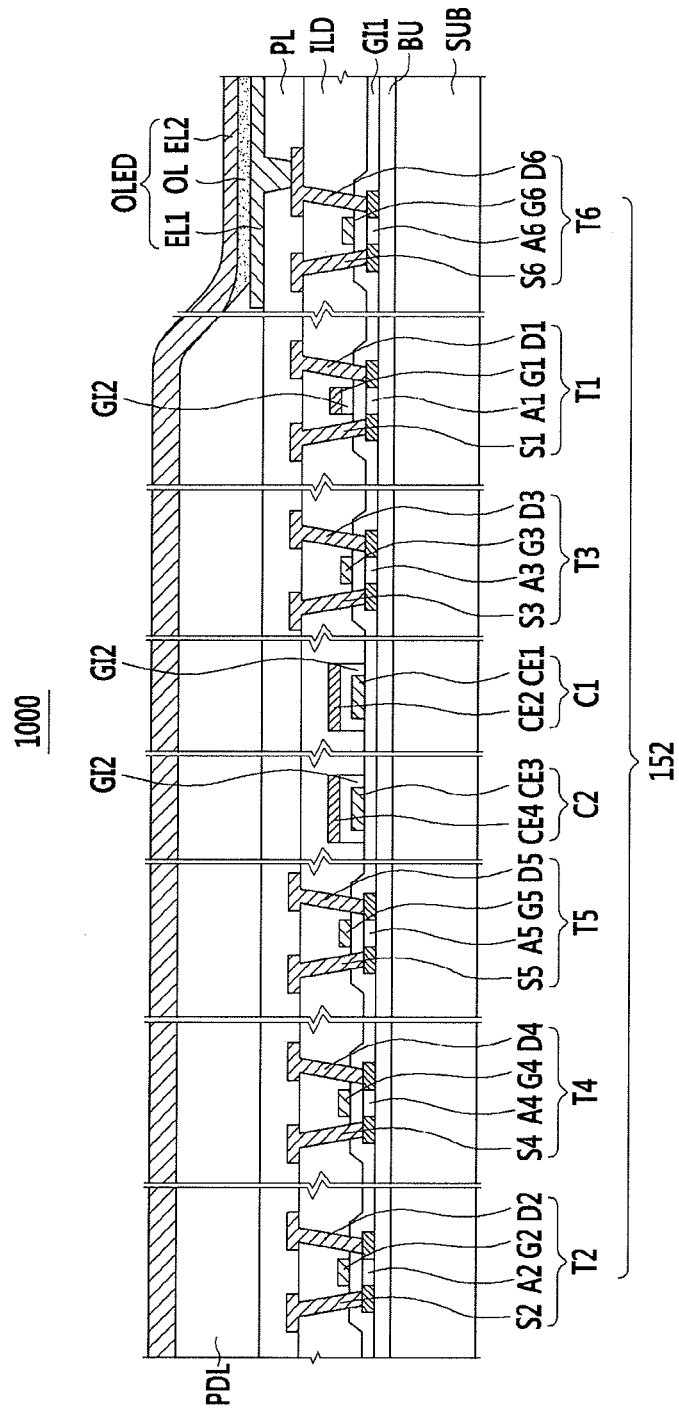
FIG. 3 is a cross-sectional view of the pixel circuit and the OLED FIG. 2.

FIG. 2 is a circuit diagram of a pixel shown in FIG. 1, and FIG. 3 is a cross-sectional view of a pixel circuit and an OLED of FIG. 2.

As shown in FIG. 2 and FIG. 3, the pixel 150 includes an OLED connected between the first power source ELVDD and the second power source ELVSS, and a pixel circuit 152 connected between the first power source ELVDD and the OLED to control driving power supplied to the OLED.

An anode EL1 of the OLED is connected to the driving power line ELVDDL connected to the first power source ELVDD via the pixel circuit 152, and a cathode of the OLED is connected to the second power source ELVSS. The OLED emits light with luminance that corresponds to a driving current flowing to the OLED when driving power is supplied thereto from the first power source ELVDD through the pixel circuit 152 and common power is supplied thereto from the second power source ELVSS.

The pixel circuit 152 includes a first thin film transistor T1, a second thin film transistor T2, a third thin film transistor T3, a fourth thin film transistor T4, a fifth thin film transistor T5, a sixth thin film transistor T6, a first capacitor C1, and a second capacitor C2.

The first thin film transistor T1 functions as the driving transistor of the pixel 150. The first thin film transistor T1 is connected between the driving power line ELVDDL and the OLED, and supplies driving power that corresponds to a data signal to the OLED from the first power source ELVDD during a light emission period of the pixel 150. The first thin film transistor T1 includes a first active layer A1, a first gate electrode G1, a first source electrode S1, and a first drain electrode D1.

The first active layer A1 includes polysilicon, and includes source and drain areas that are doped with an impurity and a channel area provided between the source area and the drain area. The first active layer A1 is provided between a buffer layer BU formed in the substrate SUB and a first insulation layer GI1. When being turned on by the first gate electrode G1, the first active layer A1 establishes a connection between the driving power line ELVDDL among the data wires DW and the OLED.

The first gate electrode G1 is connected with a first capacitor electrode CE1 of the first capacitor C1, and is provided in the same layer as the second capacitor electrode CE2. The first gate electrode G1 is provided on the channel area of the first active layer A1, interposing the first insulation layer GI1 and the second insulation layer GI2 that are sequentially layered on the first active layer A1. That is, the first insulation layer GI1 and the second insulation layer GI2 are provided between the first gate electrode G1 and the first active layer A1.

The first insulation layer GI1 totally covers the first active layer A1, however the second insulation layer GI2 is formed with the same width as the first gate electrode G1 and is only provided on the channel region. Accordingly, the thick insulation layer (the first insulation layer GI1 and the second insulation layer GI2) is positioned between the channel region of the first active layer A1 and the first gate electrode G1, and the thin insulation layer (the first insulation layer GI1) is positioned on the source region and the drain region of the first active layer A1.

The first gate electrode G1 is not doped with an impurity. The reason that the first gate electrode G1 is not doped with an impurity will be described in a manufacturing method of the (OLED) display 1000 of the first exemplary embodiment.

The first source electrode S1 is connected with the driving power line ELVDDL via the fifth thin film transistor T5. The first drain electrode D1 is connected with the OLED via the sixth thin film transistor T6.

The second thin film transistor T2 functions as a switching transistor of the pixel 150. The second thin film transistor T2 is connected between the data line DAm and the first thin film transistor T1, and transmits a data signal supplied from the data line DAm to the pixel 150 when the scan signal is supplied from the first scan line SCn. The second thin film transistor T2 includes a second active layer A2, the second gate electrode G2, the second source electrode S2, and the second drain electrode D2.

The second active layer A2 includes polysilicon, and includes source and drain areas that are doped with an impurity and a channel area provided between the source area and the drain area. The second active layer A2 is provided between the buffer layer BU formed in the substrate SUB and the first insulation layer GI1. When being turned on by the second gate electrode G2, the second active layer A2 establishes a connection between the data line DAm among the data wires DW and the first thin film transistor T1.

The second gate electrode G2 is connected with the first scan line SCn, and is provided on the channel area of the second active layer A2, interposing the first insulation layer GI1 therebetween. That is, the first insulation layer GI1 is provided between the second gate electrode G2 and the second active layer A2. The second gate electrode G2 is doped with an impurity. The reason that the second gate electrode G2 is doped with an impurity will be described in a manufacturing method of the OLED display 1000 of the first exemplary embodiment.

The second source electrode S2 is connected with the data line DAm. The second drain electrode D2 is connected with a first source electrode S1 of the first thin film transistor T1.

The third thin film transistor T3 functions as a compensation transistor of the pixel. The third thin film transistor T3 is connected between a first drain electrode D1 of the first thin film transistor T1 and the first gate electrode G1, and compensates a threshold voltage of the first thin film transistor T1 by diode-connecting the first thin film transistor T1 when a data signal is supplied to the pixel 150. The third thin film transistor T3 includes a third active layer A3, a third gate electrode G3, a third source electrode S3, and a third drain electrode D3.

The third active layer A3 includes polysilicon, and includes source and drain areas that are doped with an impurity and a channel area provided between the source area and the drain area. The third active layer A3 is provided between the buffer layer BU formed in the substrate SUB and the first insulation layer GI1.

The third gate electrode G3 is connected to the first scan line SCn and is positioned on the channel region of the third active layer A3 via the first insulation layer GI1. That is, the third gate electrode G3 is the same layer as the second gate electrode G2. The third gate electrode G3 is doped with an impurity. The reason that the third gate electrode G3 is doped with an impurity will be described in a manufacturing method of the OLED display 1000.

The third source electrode S3 is connected with a first gate electrode G1 of the first thin film transistor T1. The third drain electrode D3 is connected with the first drain electrode D1 of the first thin film transistor T1.

The fourth thin film transistor T4 functions as a switching transistor of the pixel 150. The fourth thin film transistor T4 is connected between the initialization power line Vinit and the first gate electrode G1 of the first thin film transistor T1, and initializes the first thin film transistor T1 for smoothly supplying the data signal to the pixel 150 during the data programming period during which the data signal is input to the pixel 150. That is, the fourth thin film transistor T4 initializes the first thin film transistor T1 by transmitting initialization power supplied to the initialization power line Vinit when the scan signal is supplied from the second scan line SCn-1 during an initialization period that is prior to a data programming period to the pixel 150. The fourth thin film transistor T4 includes a fourth active layer A4, a fourth gate electrode G4, a fourth source electrode S4, and a fourth drain electrode D4.

The fourth active layer A4 includes polysilicon, and includes source and drain areas that are doped with an impurity and a channel area provided between the source area and the drain area. The fourth active layer A4 is provided between the buffer layer BU formed in the substrate SUB and the first insulation layer GI1.

The fourth gate electrode G4 is connected with the second scan line SCn-1, and is provided on the channel region of the fourth active layer A4 via the first insulation layer GI1. That is, the fourth gate electrode G4 is at the same layer as the second gate electrode G2. The fourth gate electrode G4 is doped with an impurity. The reason that the fourth gate electrode G4 is doped with an impurity will be described in a manufacturing method of the (OLED) display 1000 of the first exemplary embodiment.

The fourth source electrode S4 is connected with the initialization power line Vinit. The fourth drain electrode D4 is connected with the first gate electrode G1 of the first thin film transistor T1.

The fifth thin film transistor T5 functions as a switching transistor of the pixel 150. The fifth thin film transistor T5 is connected between the driving power line ELVDDL and the first thin film transistor T1, and disconnects the connection between the first power source ELVDD and the first thin film transistor T1 during a non-light emission period of the pixel 150 and establishes a connection between the first power source ELVDD and the first thin film transistor T1 during a light emission period of the pixel 150. The fifth thin film transistor T5 includes a fifth active layer A5, a fifth gate electrode G5, a fifth source electrode S5, and a fifth drain electrode D5.

The fifth active layer A5 includes polysilicon, and includes source and drain areas that are doped with an impurity and a channel area provided between the source area and the drain area. The fifth active layer A5 is provided between the buffer layer BU formed in the substrate SUB and the first insulation layer GM.

The fifth gate electrode G5 is connected with the light emission control line En, and is provided on the channel region of the fifth active layer A5 via the first insulation layer GI1. That is, the fifth gate electrode G5 is at the same layer as the second gate electrode G2. The fifth gate electrode G5 is doped with an impurity. The reason that the fifth gate electrode G5 is doped with an impurity will be described in a manufacturing method of OLED display 1000.

The fifth source electrode S5 is connected with the driving power line ELVDDL. The fifth drain electrode D5 is connected with the first source electrode S1 of the first thin film transistor T1.

The sixth thin film transistor T6 functions as a switching transistor of the pixel 150. The sixth thin film transistor T6 is connected between the first thin film transistor T1 and the OLED, and disconnects the connection between the first thin film transistor T1 and the OLED during the non-light emission period of the pixel 150 and establishes the connection between the first thin film transistor T1 and the OLED during the light emission period of the pixel 150. The sixth thin film transistor T6 includes a sixth active layer A6, a sixth gate electrode G6, a sixth source electrode S6, and a sixth drain electrode D6.

The sixth active layer A6 includes polysilicon, and includes source and drain areas that are doped with an impurity and a channel area provided between the source area and the drain area. The sixth active layer A6 is provided between the buffer layer BU formed in the substrate SUB and the first insulation layer GI1.

The sixth gate electrode G6 is connected with the light emission control line En and is poisoned on the channel region of the sixth active layer A6 via the first insulation layer GI1. That is, the sixth gate electrode G6 is positioned at the same layer as the second gate electrode G2. The sixth gate electrode G6 is doped with an impurity. The reason that the sixth gate electrode G6 is doped with an impurity will be described in a manufacturing method of the OLED display 1000.

The sixth source electrode S6 is connected with the first drain electrode D1 of the first thin film transistor T1. The sixth drain electrode D6 is connected with the anode EL1 of the OLED.

Meanwhile, in the OLED display 1000, the first source electrode S1 to the sixth source electrode S6 and the first drain electrode D1 to the sixth drain electrode D6 of each of the first thin film transistor T1 to the sixth thin film transistor T6 are respectively formed in different layers from the layers where the first active layer A1 to the sixth active layer A6 are formed and are thus connected with the first active layer A1 to the sixth active layer A6 through the first insulation layer GI1 and the third insulation layer ILD. However, the first source electrode S1 to the sixth source electrode S6 and the first drain electrode D1 to the sixth drain electrode D6 may be respectively formed at the same layer as the first active layer A1 to the sixth active layer A6. That is, the source electrode and the drain electrode of each of the thin film transistors can be formed of polysilicon selectively doped with an impurity.

The first capacitor C1 stores the data signal supplied to the pixel 150 during the data programming period and functions as a storage capacitor maintaining the data signal during one frame. The first capacitor C1 is connected to the driving power source line ELVDDL and the first gate electrode G1 of the first thin film transistor T1. The first capacitor C1 includes a first capacitor electrode CE1 and a second capacitor electrode CE2.

The first capacitor electrode CE1 is connected with the first gate electrode G1 of the first thin film transistor T1 connected with the initialization power line Vinit, and is provided in the same layer as the second gate electrode G2 to the sixth gate electrode G6. The second capacitor electrode CE2 is connected with the driving power line ELVDDL among the data wires DW, and is provided at the same layer as the first gate electrode G1. That is, the second capacitor electrode CE2 is positioned on the first capacitor electrode CE1 via the second insulation layer GI2. As shown in FIG. 1, the second capacitor electrode CE2 may be extended in a first direction, crossing the neighboring pixel 150.

The second capacitor C2 functions as a boosting capacitor compensating a voltage drop due to a load in the OLED display 1000. The second capacitor C2 is connected between the first capacitor electrode CE1 of the first capacitor C1 and the first scan line SCn among the gate wires GW. That is, when a voltage level of the present scan signal is changed, the second capacitor C2 increases a voltage of the first gate electrode G1 of the first thin film transistor T1 by coupling at a time point that the supply of the present scan signal is blocked to compensate the voltage drop due to the load in the OLED display 1000. The second capacitor C2 includes a third capacitor electrode CE3 and a fourth capacitor electrode CE4.

The third capacitor electrode CE3 is connected with the first capacitor electrode CE1 of the first capacitor C1, and is provided in the same layer of the second gate electrode G2 to the sixth gate electrode G6. The fourth capacitor electrode CE4 is connected to the first scan line SCn among the gate wires GW and is positioned at the same layer as the first gate electrode G1. That is, the fourth capacitor electrode CE4 is positioned on the third capacitor electrode CE3 via the second insulation layer GI2.

In the first capacitor C1, the second capacitor electrode CE2 may be formed with a larger width than the first capacitor electrode CE1. Also, the second insulation layer GI2 has the same width as the second capacitor electrode CE2 thereby covering the upper surface and the side surface of the first capacitor electrode CE1. In the second capacitor C2, the fourth capacitor electrode CE4 has a larger width than the third capacitor electrode CE3. Also, the second insulation layer GI2 is formed with the same width as the fourth capacitor electrode CE4 thereby covering the upper surface and the side surface of the third capacitor electrode CE3.

The OLED includes the anode EL1, the organic emission layer (OL), and the cathode EL2. The anode EL1 is positioned on the sixth drain electrode D6 via the fourth insulation layer PL, and is connected to the sixth drain electrode D6. The position of the organic emission layer OL may be determined by the pixel definition layer PDL. The cathode EL2 is connected to the second power source ELVSS, and may be totally formed on the organic emission layer OL and the pixel definition layer PDL.

Hereinafter, operation of the pixel 150 will be described.

First, a previous scan signal of a low level is supplied through the second scan line SCn-1 during a first period that is set as the initialization period. Then, the fourth thin film transistor T4 is turned on corresponding to the previous scan signal of a low level, and initialization power is supplied to the first thin film transistor T1 through the fourth thin film transistor T4 from the initialization power line Vinit such that the first thin film transistor T1 is initialized.

Next, the present scan signal of a low level is supplied through the first scan signal SCn during a second period set as the data programming period. Then, the second thin film transistor T2 and the third thin film transistor T3 are turned on corresponding to the low-level present scan signal. The first thin film transistor T1 is turned on by being diode-connected by the third thin film transistor T3, and particularly, the first thin film transistor T1 is diode-connected in a forward direction because the first thin film transistor T1 is initialized during the first period.

Thus, the data signal supplied from the data line DAm flows via the second thin film transistor T2, the first thin film transistor T1, and the third thin film transistor T3, and accordingly, a voltage corresponding to a difference between the data signal and the threshold voltage of the first thin film transistor T1 is stored in the first capacitor C1.

Next, when the voltage level of the present scan signal is changed to high level while the supply of the present scan signal is blocked, a voltage applied to the first gate electrode G1 of the first thin film transistor T1 is changed corresponding to a voltage change range of the present scan signal due to coupling of the second capacitor C2. In this case, since the voltage applied to the first gate electrode G1 of the first thin film transistor T1 is changed by charge sharing between the first capacitor C1 and the second capacitor C2, a change amount of the voltage applied to the first gate electrode G1 is changed in proportion to the voltage change width of the present scan signal and the charge sharing value between the first capacitor C1 and the second capacitor C2.

Next, a light emission control signal supplied from the light emission control line En is changed from high level to low level during a third period that is set as the light emission period. Then, the fifth thin film transistor T5 and the sixth thin film transistor T6 are turned on by the low-level light emission control signal during the third period. Accordingly, a driving current flows through the driving power line ELVDDL from the first power source ELVDD, via the fifth thin film transistor T5, the first thin film transistor T1, the sixth thin film transistor T6, and the OLED.

The driving current is controlled by the first thin film transistor T1, and thus the first thin film transistor T1 generates a driving current that corresponds to the voltage supplied to the first gate electrode G1 of the first thin film transistor T1. In this case, a voltage to which the threshold voltage of the first thin film transistor T1 is reflected is stored in the first capacitor C1 during the second period, and therefore the threshold voltage of the first transistor T1 is compensated during the third period.

Figure 4:
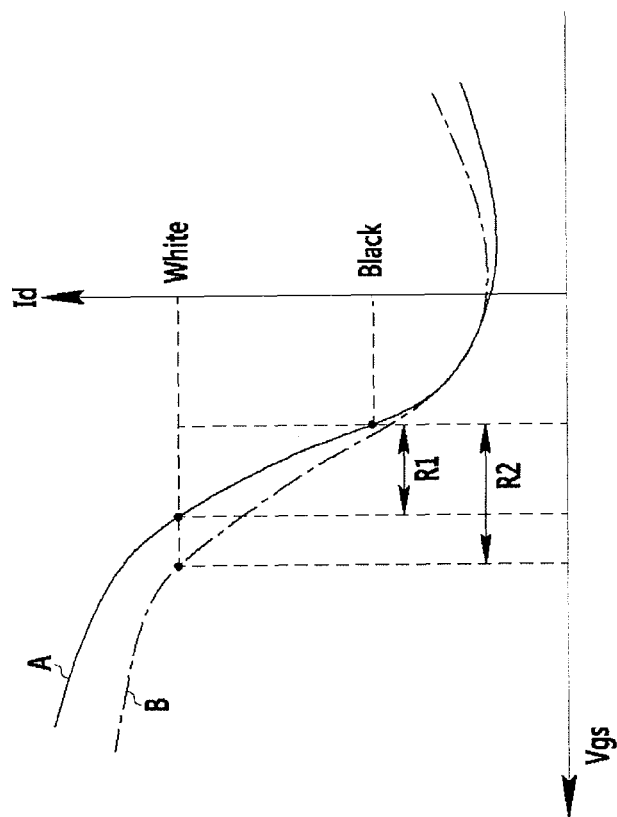
FIG. 4 and FIG. 5 are graphs to explain an effect of the OLED display according to the first embodiment.
Figure 5:
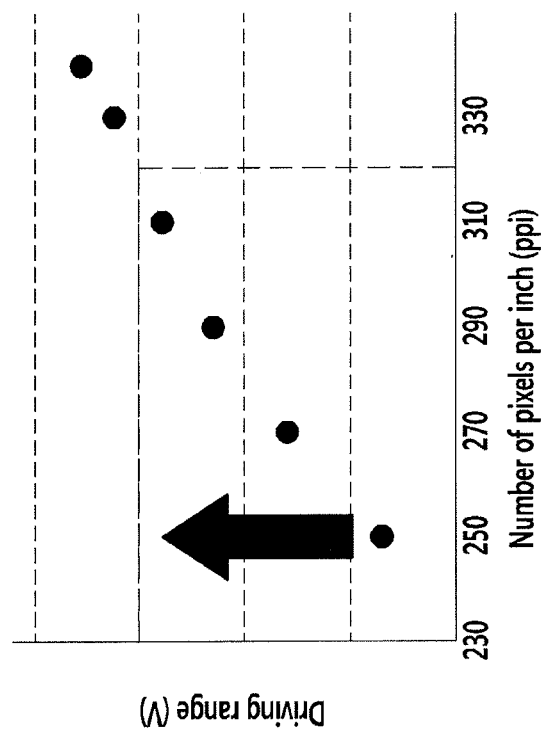

FIG. 4 and FIG. 5 are graphs to explain an effect of an OLED display according to the first embodiment.

In FIG. 4, a horizontal axis represents is a gate voltage Vgs applied to the first gate electrode of the first thin film transistor, and a vertical axis represents a driving current Id flowing to the OLED. A curved line A is a case that a thin insulation layer is formed between the first active layer and the first gate electrode of the first thin film transistor, and a curved line B is a case that a thicker insulation layer is formed between the first active layer and the first gate electrode of the first thin film transistor.

Referring to FIG. 4, in the case of forming the thin insulation layer in the first thin film transistor, when the light emitted by the OLED is displayed as a black color and a white color according to the driving current Id flowing to the OLED, the gate voltage Vgs applied to the first gate electrode has the first range R1. That is, the driving range of the gate voltage applied to the first gate electrode becomes the first range R1.

On the other hand, in the case of forming the thick insulation layer in the first thin film transistor, when the light emitted by the OLED is displayed as a black color and a white color according to the driving current Id flowing to the OLED, the gate voltage Vgs applied to the first gate electrode has the second range R2 that is wider than the first range R1. That is, the driving range of the gate voltage applied to the first gate electrode becomes the second range R2 that is wider than the first range R1.

In FIG. 5, the horizontal axis represents the number of pixels per inch of the OLED display, and the vertical axis represents the driving range of the first thin film transistor. Referring to FIG. 5, to realize high resolution of the OLED display as the pixel number per inch (ppi) of the OLED display is increased, a high driving range is generally required to have a sufficient grayscale for the light emitted from the OLED.

In the described OLED display 1000, the first thin film transistor T1 may widen the driving range of the gate voltage applied to the first gate electrode G1 by the thick insulation layer (the first insulation layer GI1 and the second insulation layer GI2). Accordingly, by changing the size of the gate voltage, the grayscale of the light emitted from the OLED may be precisely controlled, and as a result, the resolution of the OLED display may be increased and the display quality may be improved.

Also, the source region and the drain region of the first thin film transistor T1 is covered by a thin insulation layer (the first insulation layer GI1) thereby smoothing the impurity doping. Accordingly, it is not necessary to increase the doping accelerating voltage such that the manufacturing process is easy.

FIG. 6 to FIG. 9 are cross-sectional views for description of a manufacturing method of the OLED display of the first embodiment.

Figure 6:
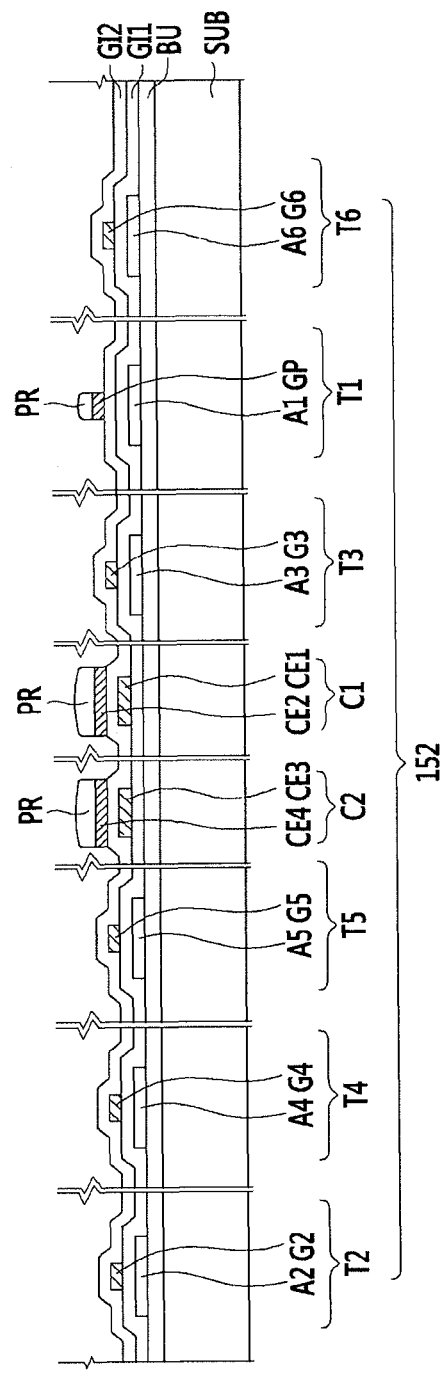
FIG. 6 to FIG. 9 are cross-sectional views for description of a manufacturing method of the OLED display of the first embodiment.

Referring to FIG. 6, a buffer layer BU and a polysilicon layer are formed on the substrate SUB, and the polysilicon layer is patterned to form the first active layer A1 to the sixth active layer A6. Here, the polysilicon layer may be formed by crystallizing an amorphous silicon layer using a laser, heat, or a metal catalyst. Meanwhile, the first active layer A1 to the sixth active layer A6 may be formed by crystallizing an amorphous silicon pattern that is patterned using a laser, heat, or a metal catalyst after patterning the amorphous silicon layer.

The first insulation layer GI1 is formed on the first active layer A1 to the sixth active layer A6 and a metal layer is formed on the first insulation layer GI1, and then the metal layer is patterned to form the second gate electrode G2 to the sixth gate electrode G6, the first capacitor electrode CE1, and the third capacitor electrode CE3. The second insulation layer GI2 covering the second gate electrode G2 to the sixth gate electrode G6, the first capacitor electrode CE1, and the third capacitor electrode CE3 is formed on the first insulation layer GI1.

The metal layer is formed on the second insulation layer GI2 and patterned by using a photoresist layer (PR) as a etching mask to form the first gate electrode G1, the second capacitor electrode CE2, and the fourth capacitor electrode CE4. The photoresist layer (PR) is positioned on the first gate electrode G1, the second capacitor electrode CE2, and the fourth capacitor electrode CE4. The second capacitor electrode CE2 may be formed with a larger width than the first capacitor electrode CE1, and the fourth capacitor electrode CE4 may be formed with a larger width than the third capacitor electrode CE3.

Figure 7:
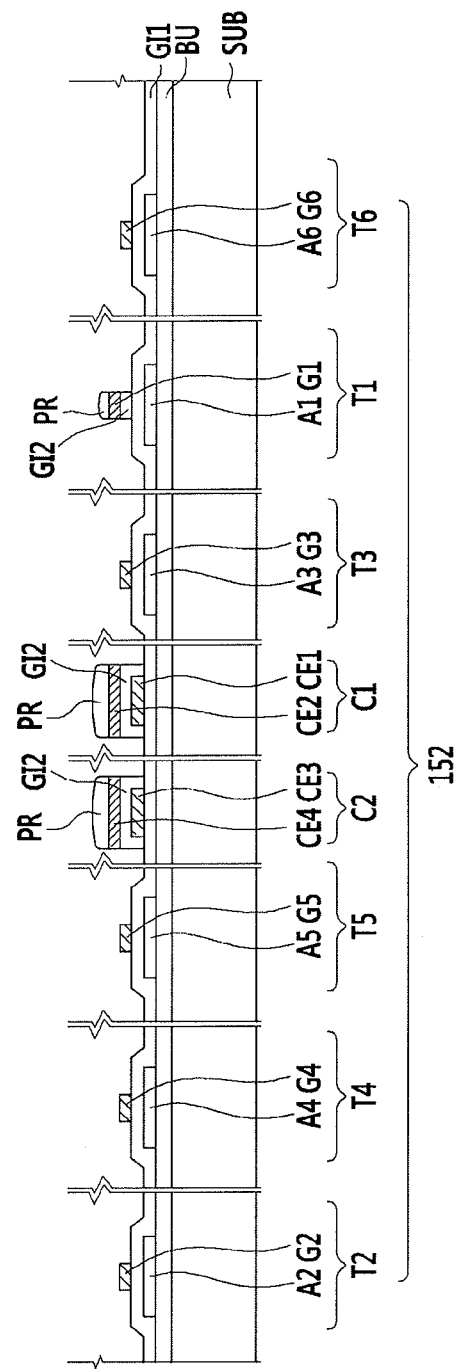

Referring to FIG. 7, the second insulation layer GI2 is etched by using the photoresist layer (PR) as an etching mask. As a result, the second insulation layer GI2 selectively remains under the first gate electrode G1, the second capacitor electrode CE2, and the fourth capacitor electrode CE4. The second insulation layer GI2 is formed with the same width as the first gate electrode G1, thereby covering the upper surface and the side surface of the first capacitor electrode CE1 and the third capacitor electrode CE3.

Figure 8:
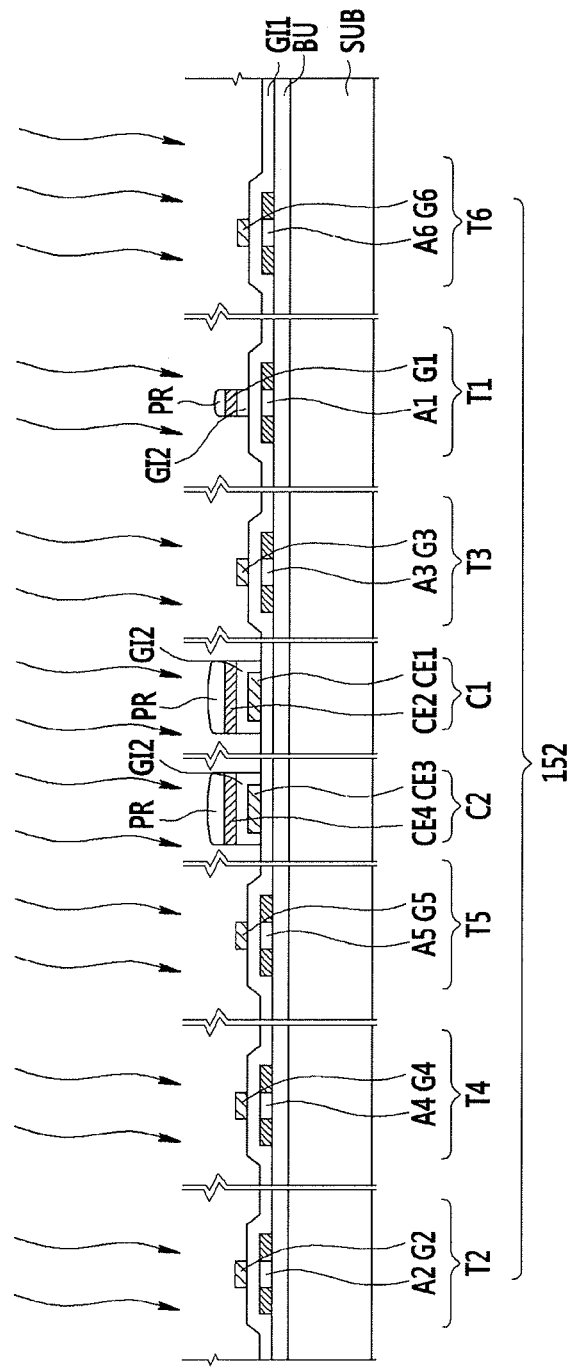

Referring to FIG. 8, the impurity is doped to each source region and drain region of the first active layer A1 to the sixth active layer A6 by using the photoresist layer (PR) and the second gate electrode G2 to the sixth gate electrode G6 as a mask. At this time, the first gate electrode G1 is covered by the photoresist layer (PR) to not be doped with the impurity, however the second gate electrode G2 to the sixth gate electrode G6 are doped with the impurity. The impurity used in the doping may be selected from various known materials. The photoresist layer (PR) is removed after completing the doping.

Figure 9:
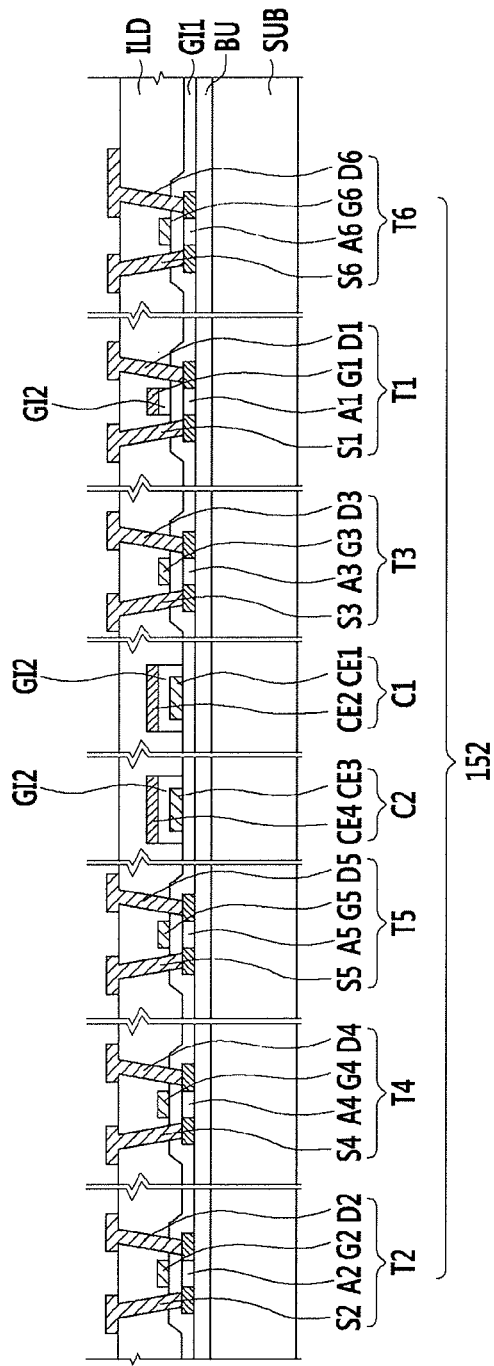

Referring to FIG. 9, the third insulation layer ILD covering the first gate electrode G1 to the sixth gate electrode G6, the second capacitor electrode CE2, and the fourth capacitor electrode CE4 is formed on the substrate SUB. Next, via holes are formed in the third insulation layer ILD, and the first source electrode S1 to the sixth source electrode S6 and the first drain electrode D1 to the sixth drain electrode D6 respectively connected to the source region and the drain region of the first active layer A1 to the sixth active layer A6 are formed. Accordingly, the first thin film transistor T1 to the sixth thin film transistor T6, the first capacitor C1, and the second capacitor C2 are completed.

Then, the OLED is formed together with the fourth insulation layer PL and the pixel definition layer PDL such that the OLED display 1000 can be manufactured. In the OLED display 1000, the driving range of the gate voltage applied to the first gate electrode G1 may be increased by the thick insulation layer (the first insulation layer GI1 and the second insulation layer GI2) of the first thin film transistor T1. Also, the source region and the drain region of the first thin film transistor T1 are covered by the thin insulation layer (the first insulation layer GI1) thereby smoothing the impurity doping.

At this time, the thickness of the second insulation layer GI2 is not affected by the impurity doping process such that the thickness of the second insulation layer GI2 may be increased more than a predetermined degree regardless of the impurity doping process. Accordingly, the entire thickness of the insulation layers GI1 and GI2 formed between the first active layer A1 and the first gate electrode G1 of the first thin film transistor T1 may be increased more than a predetermined degree regardless of the doping process.

Also, the thin insulation layer (the first insulation layer GI1) is positioned in the second thin film transistor T2 to the sixth thin film transistor T6 as the switching thin film transistors such that each charge mobility of the second thin film transistor T2 to the sixth thin film transistor T6 is increased and simultaneously the threshold voltage thereof is decreased, thereby performing the turn-on and turn-off with a fast speed. Accordingly, the load of the current flowing inside the OLED display 1000 may be minimized, thereby increasing the display quality of the image.

Also, the first capacitor electrode CE1 and the third capacitor electrode CE3 are formed with the same metal layer as the second gate electrode G2, and the second capacitor electrode CE2 and the fourth capacitor electrode CE4 are formed with the same metal layer as the first gate electrode G1. Accordingly, the first capacitor C1 and the second capacitor C2 do not need the polysilicon of which surface illumination is not uniform such that undesirable change of the storage capacitance is not generated.

That is, the first capacitor C1 and the second capacitor C2 may only store the correct storage capacitance that is initially designed such that the driving current controlled by the first thin film transistor T1 may be correctly controlled, thereby increasing the display quality.

Also, the first capacitor C1 and the second capacitor C2 include the single second insulation layer GI2 as the insulation layer, thereby increasing the storage capacitance. Accordingly, the area of the first capacitor C1 and the second capacitor C2 may be reduced such that the OLED display 1000 of the high resolution may be formed for the same area.

Figure 10:
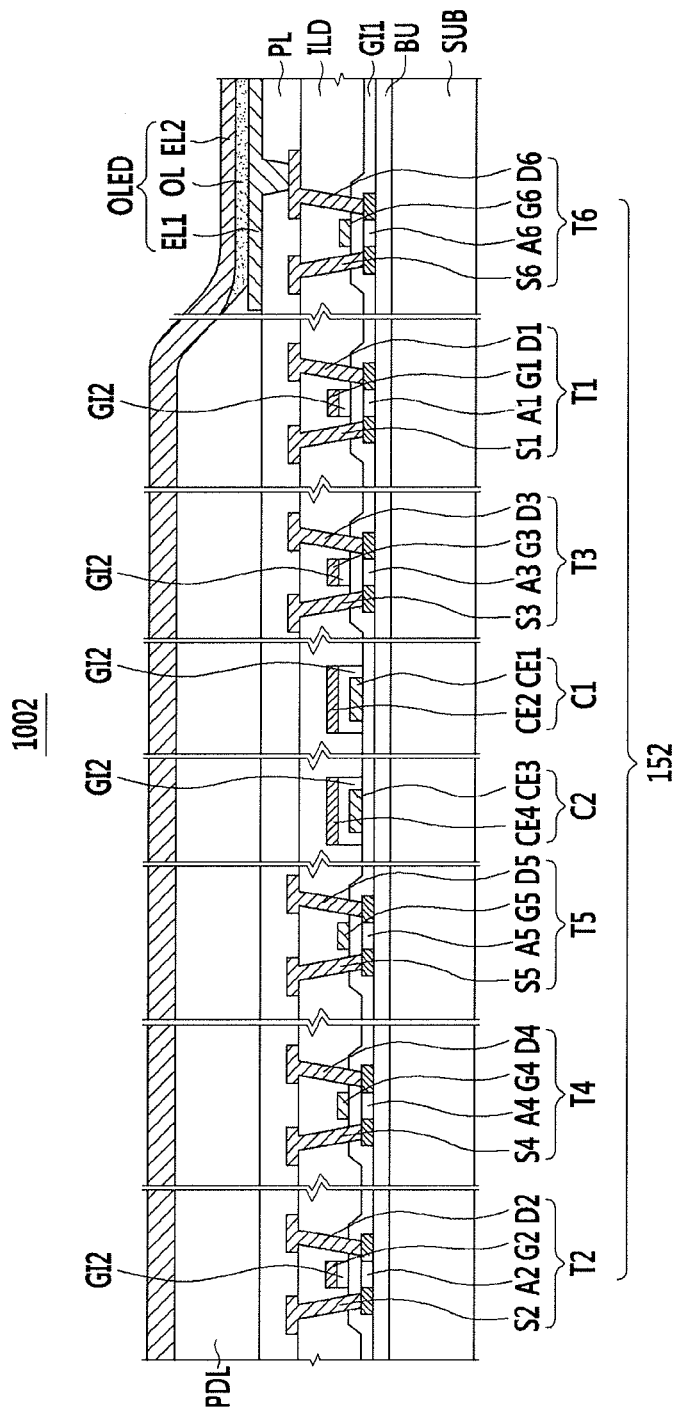
FIG. 10 is a cross-sectional view of a pixel circuit and an OLED according to a second embodiment.

FIG. 10 is a cross-sectional view of a pixel circuit and an OLED according to a second embodiment.

Next, differences from the first embodiment will be described, and the omitted descriptions are the same as in the first embodiment. For better comprehension and ease of description, the same constituent elements as in the first embodiment are indicated by the same reference numerals. In FIG. 10, reference numeral 1002 indicates an OLED display according to the second embodiment.

Referring to FIG. 10, the second gate electrode G2 of the second thin film transistor T2 is provided on the second active layer A2 via the first insulation layer GI1 and the second insulation layer GI2 interposed therebetween. Also, the third gate electrode G3 of the third thin film transistor T3 is also positioned on the third active layer A3 via the first insulation layer GI1 and the second insulation layer GI2 interposed therebetween. The second gate electrode G2 and the third gate electrode G3 are not doped with the impurity.

The second gate electrode G2 and the third gate electrode G3 are positioned at the same layer as the first gate electrode G1. In the second thin film transistor T2 and the third thin film transistor T3, the second insulation layer GI2 is formed with the same width as the second gate electrode G2 and the third gate electrode G3. The thick insulation layer (the first insulation layer GI1 and the second insulation layer GI2) is formed between the second active layer A2 and the second gate electrode G2, and the third active layer A3 and the third gate electrode G3, such the unwanted storage capacitance in the insulation layer is decreased such that the stain degree generated in the image may be reduced.

Figure 11:
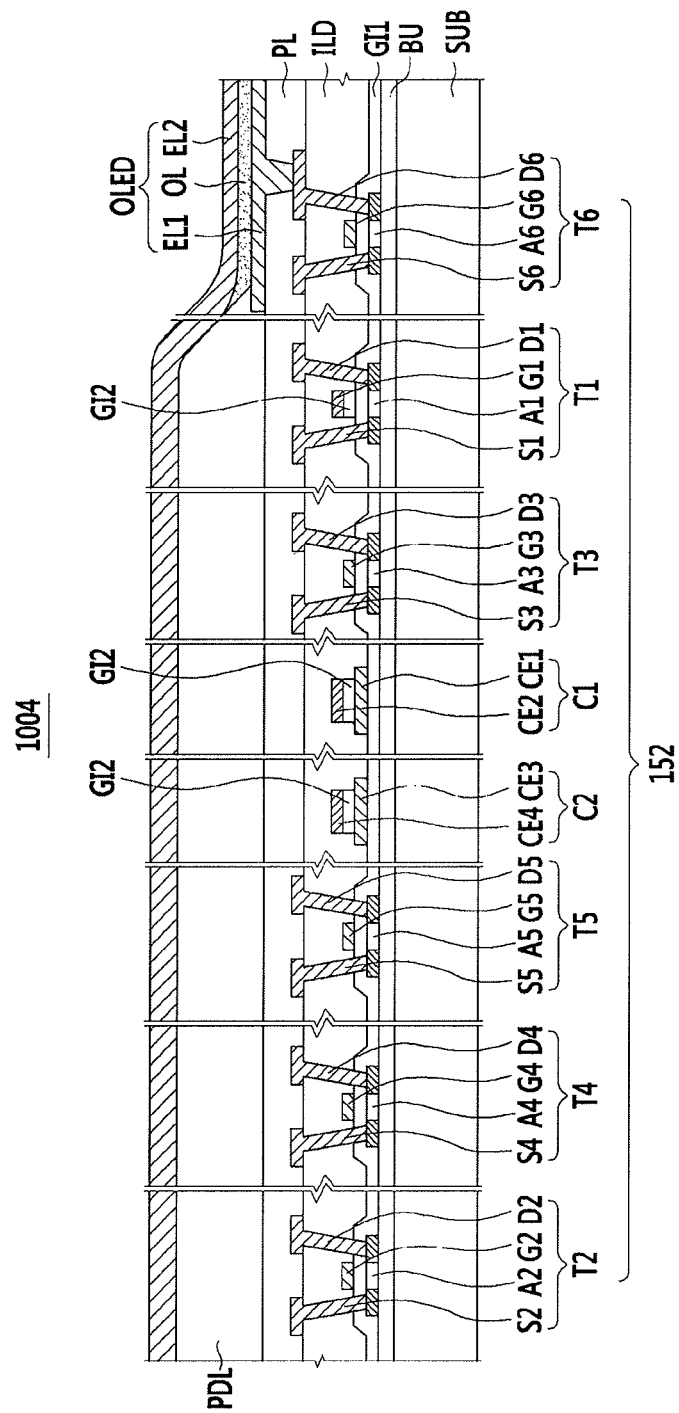
FIG. 11 is a cross-sectional view of a pixel circuit and an OLED according to a third embodiment.

FIG. 11 is a cross-sectional view of a pixel circuit and an OLED according to a third embodiment.

Referring to FIG. 11, in the OLED display 1004 of the third exemplary embodiment, the second capacitor electrode CE2 may have a smaller width than the first capacitor electrode CE1, and the fourth capacitor electrode CE4 may have a smaller width than the third capacitor electrode CE3. In the first capacitor C1 and the second capacitor C2, the second insulation layer GI2 has the same width as the second capacitor electrode CE2 and the fourth capacitor electrode CE4. Accordingly, a portion of the first capacitor electrode CE1 and the portion of the third capacitor electrode CE3 are not covered by the second insulation layer GI2.

The rest except for the first capacitor C1 and the second capacitor C2 has the same constitution as the OLED display of the first embodiment or the second embodiment. In FIG. 11, for convenience, the rest of the constitution except for the first capacitor C1 and the second capacitor C2 are shown like the OLED display of the first exemplary embodiment.

According to at least one of the disclosed embodiments, the driving thin film transistor increases the driving range of the gate voltage applied to the gate electrode by the thick insulation layer. Accordingly, by changing the size of the gate voltage, the grayscale of the light emitted from the OLED is precisely controlled. Also, the source region and the drain region of the driving thin film transistor are covered by the thin insulation layer thereby smoothing the impurity doping.

While the above embodiments have been described in connection with the accompanying drawings, it is to be understood that the present disclosure is not limited to the above embodiments, but, on the contrary, is intended to cover various modifications and equivalent arrangements included within the spirit and scope of the appended claims.

What is claimed is:

1. An organic light emitting diode (OLED) display comprising:
    a plurality of gate wires positioned over a substrate in a first direction;
    a plurality of data wires positioned over the gate wires in a second direction crossing the first direction;
    a pixel circuit including a plurality of first thin film transistors respectively electrically connected to the gate wires and the data wires; and
    an OLED electrically connected to the pixel circuit,
    wherein each of the first thin film transistors includes
    a first active layer interconnecting the data wires and the OLED, wherein the first active layer includes a channel region, a source region and a drain region doped with an impurity; and
    a first gate electrode positioned over the first active layer with first and second insulation layers sequentially interposed therebetween,
    wherein the second insulation layer is positioned on the channel region, and wherein the second insulation layer has substantially the same width as the first gate electrode formed on the second insulation layer.

2. The OLED display of claim 1, wherein the first gate electrode is not doped with the impurity.

3. The OLED display of claim 1, wherein the pixel circuit further includes a first capacitor electrically connected to the data wires, and
    wherein the first capacitor includes:
    a first capacitor electrode positioned on the first insulation layer and electrically connected to the first gate electrode; and
    a second capacitor electrode positioned over the first capacitor electrode with the second insulation layer interposed therebetween, wherein the second capacitor electrode is electrically connected to the data wires.

4. The OLED display of claim 3, wherein the distance between the second capacitor electrode and the substrate is substantially the same, as the distance between the first gate electrode and the substrate, and wherein the second capacitor electrode is formed of the same metal layer as the first gate electrode.

5. An organic light emitting diode (OLED) display comprising:
    a plurality of gate wires positioned over a substrate in a first direction;
    a plurality of data wires positioned over the gate wires in a second direction crossing the first direction;
    a pixel circuit including a plurality of first thin film transistors respectively electrically connected to the gate wires and the data wires; and
    an OLED electrically connected to the pixel circuit,
    wherein each of the first thin film transistors includes
    a first active layer interconnecting the data wires and the OLED, wherein the first active layer includes a channel region, a source region and a drain region doped with an impurity; and
    a first gate electrode positioned over the first active layer with first and second insulation layers sequentially interposed therebetween,
    wherein the second insulation layer is positioned on the channel region,
    wherein the pixel circuit further includes a first capacitor electrically connected to the data wires,
    wherein the first capacitor includes:
    a first capacitor electrode positioned on the first insulation layer and electrically connected to the first gate electrode; and
    a second capacitor electrode positioned over the first capacitor electrode with the second insulation layer interposed therebetween, wherein the second capacitor electrode is electrically connected to the data wires,
    wherein the pixel circuit further includes a second capacitor electrically connected to the gate wires, and
    wherein the second capacitor includes:
    a third capacitor electrode positioned on the first insulation layer and electrically connected to the first capacitor electrode; and
    a fourth capacitor electrode positioned over the third capacitor electrode with the second insulation layer interposed therebetween, wherein the fourth capacitor electrode is electrically connected to the gate wires.

6. The OLED display of claim 5, wherein the distance between the fourth capacitor electrode and the substrate is substantially the same as the distance between the first gate electrode and the substrate, and wherein the fourth capacitor electro b de is formed of the same metal layer as the first gate electrode.

7. The OLED display of claim 5, wherein the pixel circuit further includes the second thin film transistor electrically connected to the first thin film transistor, and wherein the second thin film transistor includes:
a second active layer interconnecting the data wires and the first thin film transistor, wherein the second active layer includes a channel region, a source region and a drain region doped with the impurity; and
a second gate electrode positioned over the second active layer with the first insulation layer interposed therebetween, wherein the second gate electrode is electrically connected to the gate wires, and doped with the impurity.

8. The OLED display of claim 7, wherein the distance between the first and third capacitor electrodes and the substrate is substantially the same as the distance between the second gate electrode and the substrate, and wherein the first and third capacitor electrodes are formed of the same metal layer as the second gate electrode.

9. The OLED display of claim 5, wherein the pixel circuit further includes the second thin film transistor electrically connected to the first thin film transistor, wherein the second thin film transistor includes:
a second active layer interconnecting the data wires and the first thin film transistor, wherein the second active layer includes a channel region, a source region and a drain region doped with the impurity; and
a second gate electrode positioned over the second active layer with the first and second insulation layers sequentially interposed therebetween,
wherein the second insulation layer is positioned on the channel region.

10. The OLED display of claim 9, wherein the second gate electrode is not doped with the impurity.

11. The OLED display of claim 5, wherein the second capacitor electrode has a larger width than the first capacitor electrode, and
the fourth capacitor electrode has a larger width than the third capacitor electrode.

12. The OLED display of claim 5, wherein the first capacitor electrode has a larger width than the second capacitor electrode, and
wherein the third capacitor electrode has a larger width than the fourth capacitor electrode.

13. An organic light emitting diode (OLED) display comprising:
a plurality of gate wires positioned over a substrate in a first direction;
a plurality of data wires positioned over the gate wires in a second direction crossing the first direction;
a pixel circuit including a plurality of first thin film transistors respectively electrically connected to the gate wires and the data wires; and
an OLED connected to the pixel circuit,
wherein at least one of the thin film transistors includes a gate electrode positioned over an active layer with first and second insulation layers sequentially interposed therebetween, while the remaining thin film transistors include a gate electrode positioned over the active layer with the first insulation layer interposed therebetween, and
wherein the second insulation layer has the same width as the gate electrode formed on the second insulation layer.

14. The OLED display of claim 13, wherein the gate electrode of at least one thin film transistor is not doped with the impurity, and
wherein the gate electrode of each of the remaining thin film transistors is doped with the impurity.

* * * * *